United States Patent
Xie et al.

(10) Patent No.: US 9,761,495 B1
(45) Date of Patent: Sep. 12, 2017

(54) METHODS OF PERFORMING CONCURRENT FIN AND GATE CUT ETCH PROCESSES FOR FINFET SEMICONDUCTOR DEVICES AND THE RESULTING DEVICES

(71) Applicant: GLOBALFOUNDRIES Inc., Grand Cayman (KY)

(72) Inventors: Ruilong Xie, Niskayuna, NY (US); Min Gyu Sung, Latham, NY (US); Catherine B. Labelle, Schenectady, NY (US); Chanro Park, Clifton Park, NY (US); Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/050,540

(22) Filed: Feb. 23, 2016

(51) Int. Cl.
| | |
|---|---|
| *H01L 21/8234* | (2006.01) |
| *H01L 21/308* | (2006.01) |
| *H01L 21/3105* | (2006.01) |
| *H01L 21/311* | (2006.01) |
| *H01L 29/66* | (2006.01) |

(52) U.S. Cl.
CPC .... *H01L 21/823431* (2013.01); *H01L 21/308* (2013.01); *H01L 21/31051* (2013.01); *H01L 21/31144* (2013.01); *H01L 21/823437* (2013.01); *H01L 21/823481* (2013.01); *H01L 29/66545* (2013.01)

(58) Field of Classification Search
CPC ............... H01L 21/8234; H01L 21/308; H01L 21/3105; H01L 21/311; H01L 29/66
See application file for complete search history.

(56) References Cited

U.S. PATENT DOCUMENTS

| | | | |
|---|---|---|---|
| 9,412,616 B1* | 8/2016 | Xie | H01L 21/31051 |
| 2013/0052781 A1* | 2/2013 | Dai | H01L 29/66795 438/275 |
| 2014/0051247 A1* | 2/2014 | Cheng | H01L 21/0337 438/689 |

* cited by examiner

*Primary Examiner* — Asok K Sarkar
*Assistant Examiner* — Dmitriy Yemelyanov
(74) *Attorney, Agent, or Firm* — Amerson Law Firm, PLLC

(57) ABSTRACT

A method includes forming a plurality of fins above a substrate. A plurality of gate structures is formed above the plurality of fins. A first mask layer is formed above the plurality of fins and the plurality of gate structures. The first mask layer has at least one fin cut opening and at least one gate cut opening defined therein. A first portion of a first fin of the plurality of fins disposed below the fin cut opening is removed to define a fin cut cavity. A second portion of a first gate structure of the plurality of gate structures disposed below the gate cut opening is removed to define a gate cut cavity. An insulating material layer is concurrently formed in at least a portion of the fin cut cavity and the gate cut cavity.

20 Claims, 16 Drawing Sheets

View X-X

View Y-Y

View Z-Z

METHODS OF PERFORMING CONCURRENT FIN AND GATE CUT ETCH PROCESSES FOR FINFET SEMICONDUCTOR DEVICES AND THE RESULTING DEVICES

BACKGROUND OF THE INVENTION

1. Field of the Invention

The present disclosure generally relates to the fabrication of integrated circuits, and, more particularly, to various methods of performing concurrent fin and gate cut etch processes for FinFET semiconductor devices and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a perspective view of an illustrative prior art integrated circuit product 100 that is formed above a semiconductor substrate 105. In this example, the product 100 includes five illustrative fins 110, 115, a shared gate structure 120, a sidewall spacer 125, and a gate cap 130. The product 100 implements two different FinFET transistor devices (N-type and P-type) with a shared gate structure. The gate structure 120 is typically comprised of a layer of insulating material (not separately shown), e.g., a layer of high-k insulating material or silicon dioxide, and one or more conductive material layers (e.g., metal and/or polysilicon) that serve as the gate electrode for the transistors on the product 100. The fins 110, 115 have a three-dimensional configuration. The portions of the fins 110, 115 covered by the gate structure 120 define the channel regions of the FinFET transistor devices on the product 100. An isolation structure 135 is formed between the fins 110, 115. The fins 110 are associated with a transistor device of a first type (e.g., N-type), and the fins 115 are associated with a transistor device of a complementary type (e.g., P-type). The gate structure 120 is shared by the N-type and P-type transistors, a common configuration for memory products, such as static random access memory (SRAM) cells.

Typically, fins are formed in a regular array. To define separate transistor devices, the length of the fins may be adjusted and some fins or portions of fins may be removed. For example, a fin cut or "FC cut" process cuts fins in the cross direction. Typically, an array of gate structures is formed above the remaining fin portion after the FC process. Subsequently a gate cut or "CT cut" process is performed to cut the gate structures in the cross direction. Each cut process requires a separate multilayer patterning stack and lithography processes, complicating the process flow and increasing the fabrication time of the semiconductor devices.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of concurrently performing a fin cut and a gate cut process for FinFET semiconductor devices, and the resulting semiconductor devices. One illustrative method includes, among other things, forming a plurality of fins above a substrate. A plurality of gate structures is formed above the plurality of fins. A first mask layer is formed above the plurality of fins and the plurality of gate structures. The first mask layer has at least one fin cut opening and at least one gate cut opening defined therein. A first portion of a first fin of the plurality of fins disposed below the fin cut opening is removed to define a fin cut cavity. A second portion of a first gate structure of the plurality of gate structures disposed below the gate cut opening is removed to define a gate cut cavity. An insulating material layer is concurrently formed in at least a portion of the fin cut cavity and the gate cut cavity.

Another illustrative method includes, among other things, forming a product including a plurality of fins defined in a substrate, a plurality of gate structures above the plurality of fins, a cap layer disposed above the plurality of gate structures, and a first dielectric layer having a first top surface coplanar with a second top surface of the cap layer. A first mask layer is formed above the cap layer and the first dielectric layer. The first mask layer has at least one fin cut opening and at least one gate cut opening defined therein. A first portion of the cap layer exposed by the gate cut opening is removed to expose a second portion of a first gate structure of the plurality of gate structures. A third portion of the cap layer exposed by the fin cut opening is removed to expose a fourth portion of a second gate structure of the plurality of gate structures. The hard mask layer is removed. The second portion of the first gate structure is removed to define a gate cut cavity. The fourth portion of the second gate structure is removed to expose a fifth portion of a first fin of the plurality of fins. The fifth portion of the first fin is removed to define a first fin cut cavity. An insulating material layer is concurrently formed in at least a portion of the fin cut cavity and the gate cut cavity.

BRIEF DESCRIPTION OF THE DRAWINGS

The disclosure may be understood by reference to the following description taken in conjunction with the accompanying drawings, in which like reference numerals identify like elements, and in which.

Figure 1:
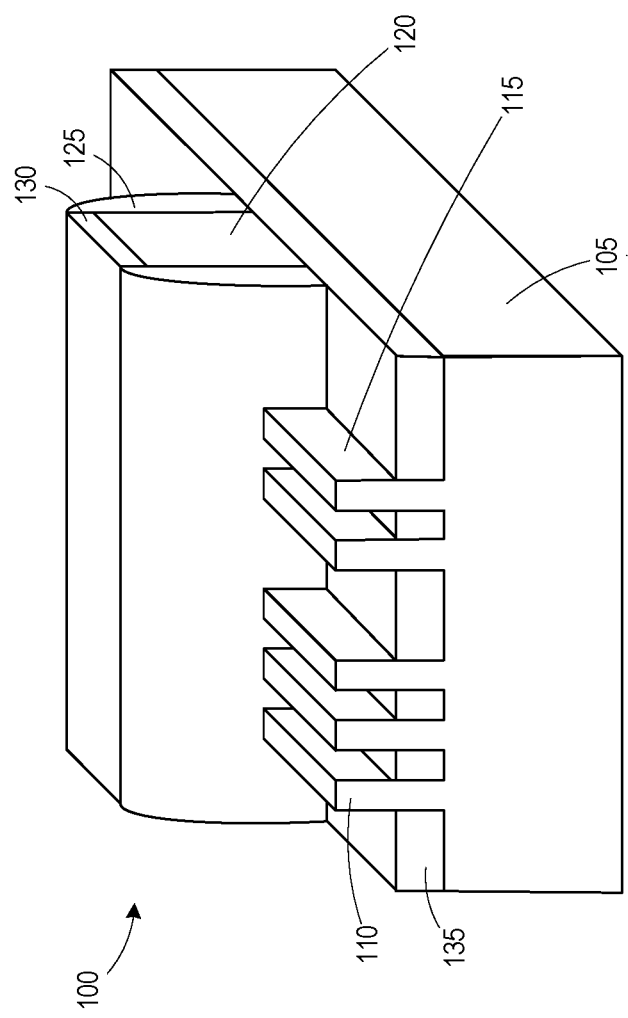
FIG. 1 is a perspective view of one illustrative embodiment of a prior art semiconductor product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of performing concurrent fin and gate cut etch processes for FinFET semiconductor devices and the resulting devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs.

The inventions disclosed herein should not be considered to be limited to the illustrative examples depicted and described herein. With reference to the attached figures, various illustrative embodiments of the methods and devices disclosed herein will now be described in more detail.

FIGS. 2A-2J depict one illustrative method disclosed for performing concurrent fin and gate cut etch processes for FinFET semiconductor devices and the resulting devices. The illustrative product 200 includes a plurality of fins 205 formed in a semiconductor substrate 210. A plurality of gate structures 215 are formed above the fins 205.

The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers.

FIGS. 2A-2J also include a simplistic plan view of the product 200 (in the upper right corner of each sheet) that depicts the location where various cross-sectional views depicted in the following drawings will be taken. More specifically, the cross-sectional view "X-X" is taken along the long axis of a gate structure 215 spanning a subset of the fins 205 that are to be cut using an FC cut opening (i.e., from bottom to top), the cross-sectional view "Y-Y" is taken along a long axis of a fin 205 that is to be cut using FC cut openings, and the cross-sectional view "Z-Z" is taken through a subset of the gate structures 215 that are to be cut using a CT cut opening in a direction that is transverse to the long axis of the gate structures 215. Not all of the features illustrated in the views "X-X", "Y-Y" and "Z-Z" are replicated in the simplistic plan view.

Figure 2A:
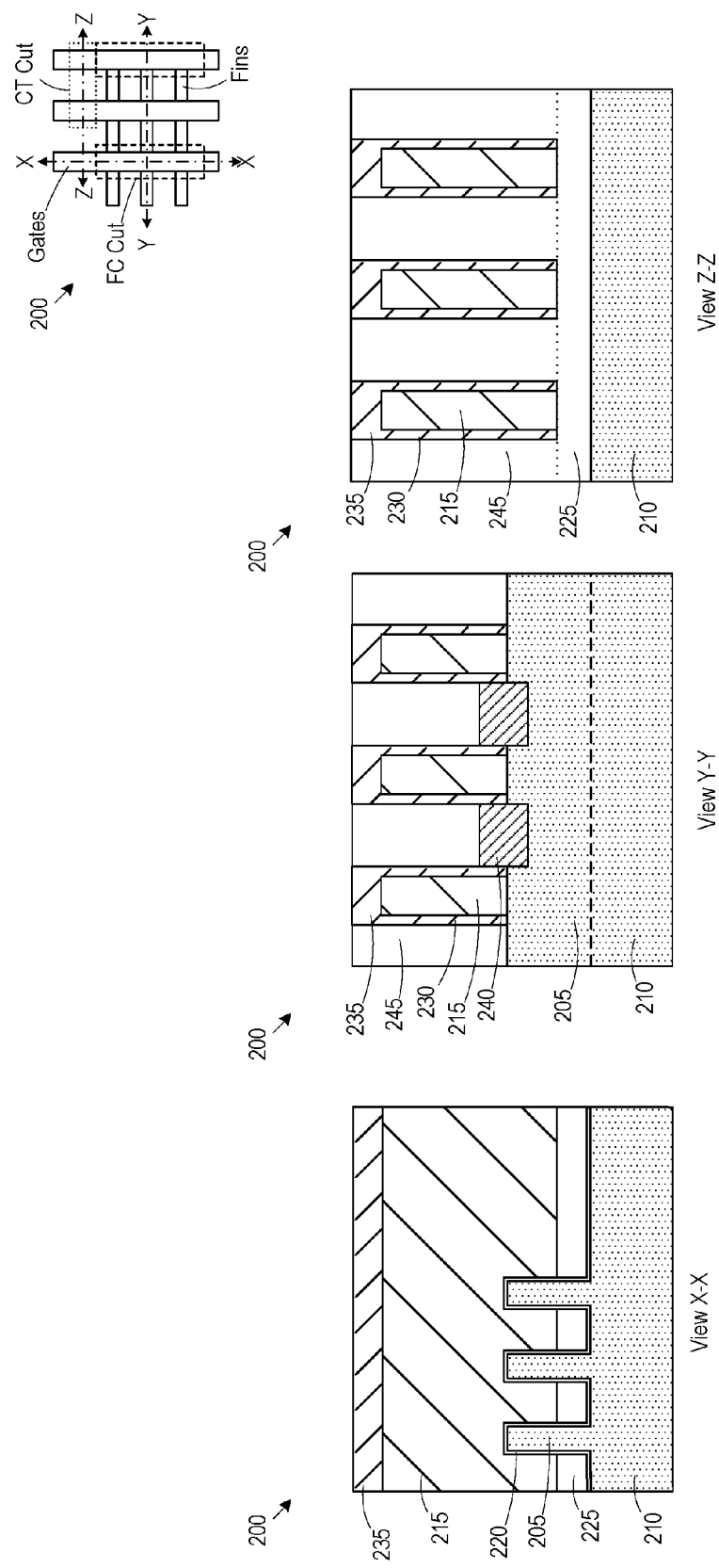
FIGS. 2A-2J depict one illustrative method disclosed for performing concurrent fin and gate cut etch processes for FinFET semiconductor devices and the resulting devices.

FIG. 2A depicts the product 200 at a point in fabrication wherein several process operations have been performed. First, the plurality of fins 205 were formed. In general, the fins 205 define an active region for forming devices, such as FinFET transistors. Next, a liner layer 220 (e.g., silicon dioxide or stacked silicon oxide and silicon nitride layers) was formed above the fins 205. The illustrative product 200 disclosed herein is depicted as being comprised of three illustrative fins 205. However, as will be recognized by those skilled in the art after a complete reading of the present application, the methods and devices disclosed herein may be employed when manufacturing devices having any number of fins. A dielectric layer 225 (e.g., silicon dioxide, a low-k dielectric material, etc.) was then formed in the trenches defined between the fins 205 to serve as an isolation structure. Subsequently, the gate structures 215 were formed above the fins 205. The gate structures 215 represent replacement or sacrificial gate structures and may include multiple layers (not separately shown), such as a gate insulation layer (e.g., silicon dioxide) and a sacrificial material (e.g., amorphous silicon). Spacers 230 and a cap layer 235 were formed on the gate structures 215. Because the spacers 230 and the cap layer 235 were formed using the same material (e.g., silicon nitride), they appear as a merged structure. Portions of the fins 205 not covered by the gate structures 215 were recessed and epitaxial source/drain regions 240 (e.g., SiGe) were formed. A dielectric layer 245 (e.g., silicon dioxide, a low-k dielectric material, or an ultra-low-k material, etc.) was formed above the fins 205 and gate structures 215 and a planarization process was performed to expose the cap layer 235.

Figure 2B:
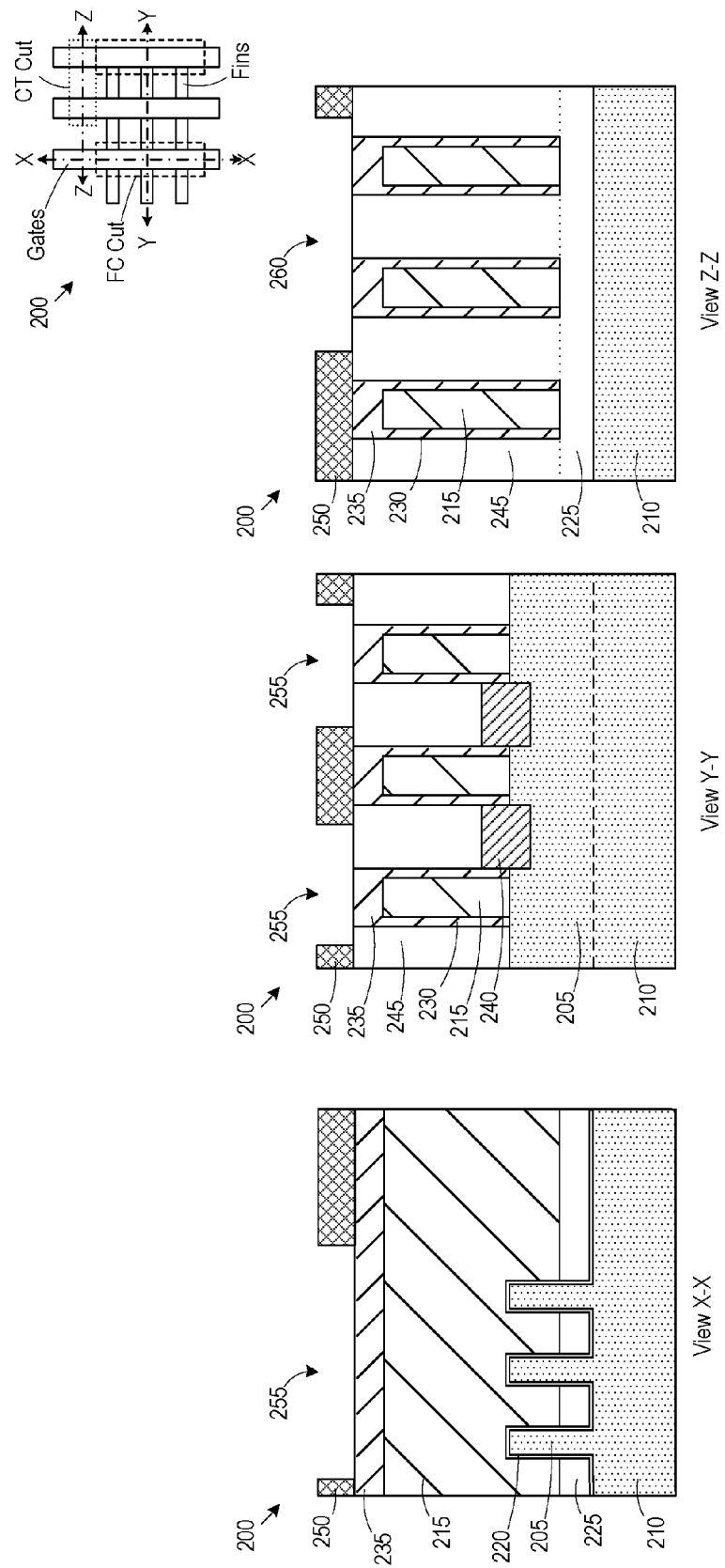

FIG. 2B illustrates the product 200 after a plurality of processes were performed to deposit and pattern a hard mask layer 250 above the dielectric layer 245 to define fin cut openings 255 and a gate cut opening 260. In the illustrated embodiment, the hard mask layer 250 was formed using a photolithography stack, including an organic planarization (OPL) layer, an anti-reflective coating (ARC) layer, and a photoresist layer. The ARC layer was formed above the OPL layer, and the photoresist was formed above the ARC layer. The photoresist layer was exposed to radiation using a reticle and developed to generate a pattern. The photoresist pattern was transferred to the ARC and OPL layers, and the photoresist and ARC layers were removed. Thus, the hard mask layer 250 may be the remaining OPL layer. As seen in the plan view, one of the fin cut openings 255 abuts the gate cut opening 260 to define a composite opening having a non-rectangular shape.

Figure 2C:
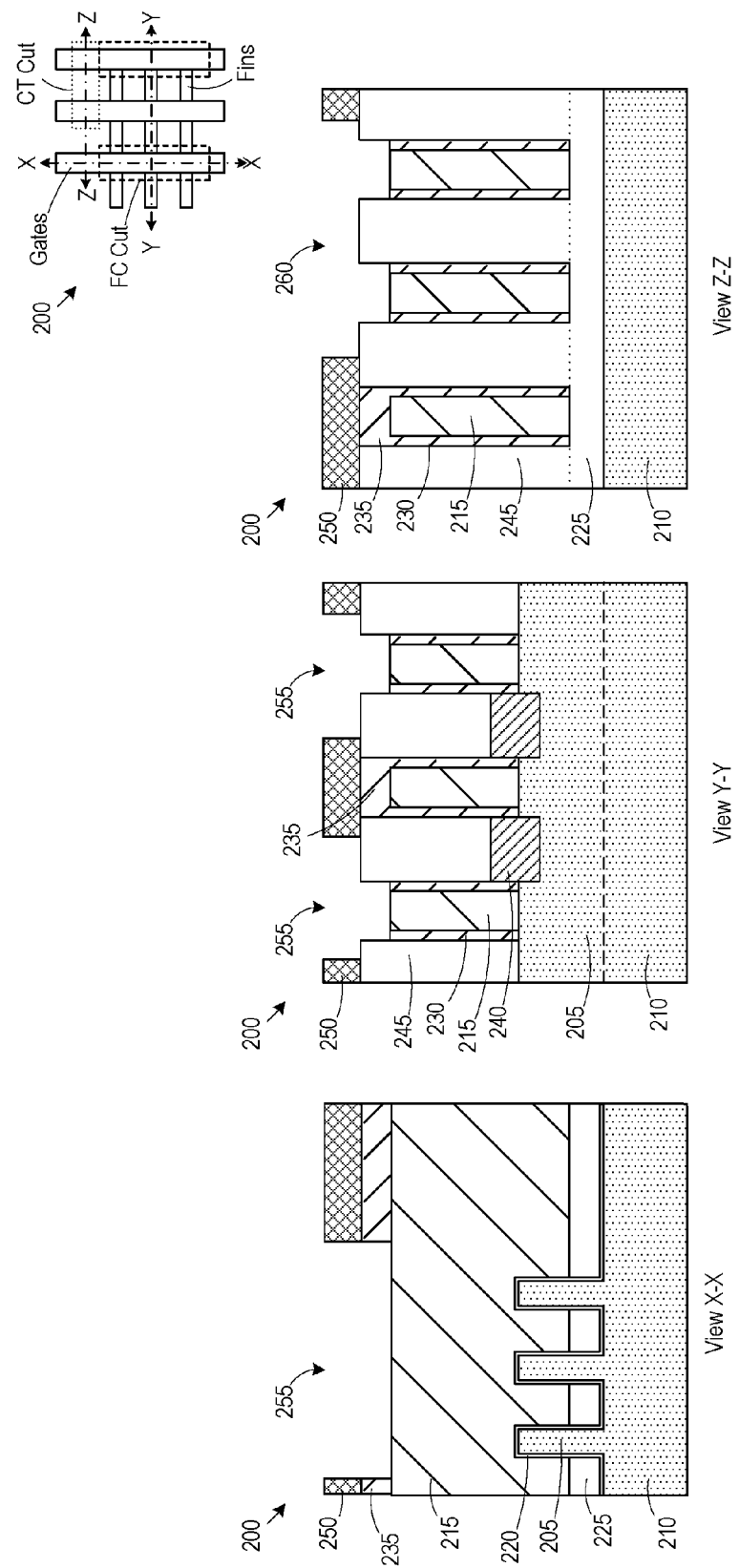

FIG. 2C illustrates the product 200 after a selective etch process was performed to remove the portions of the spacers 230 and cap layers 235 exposed by the openings 255, 260, thereby exposing the top surfaces of the gate structures 215.

Figure 2D:
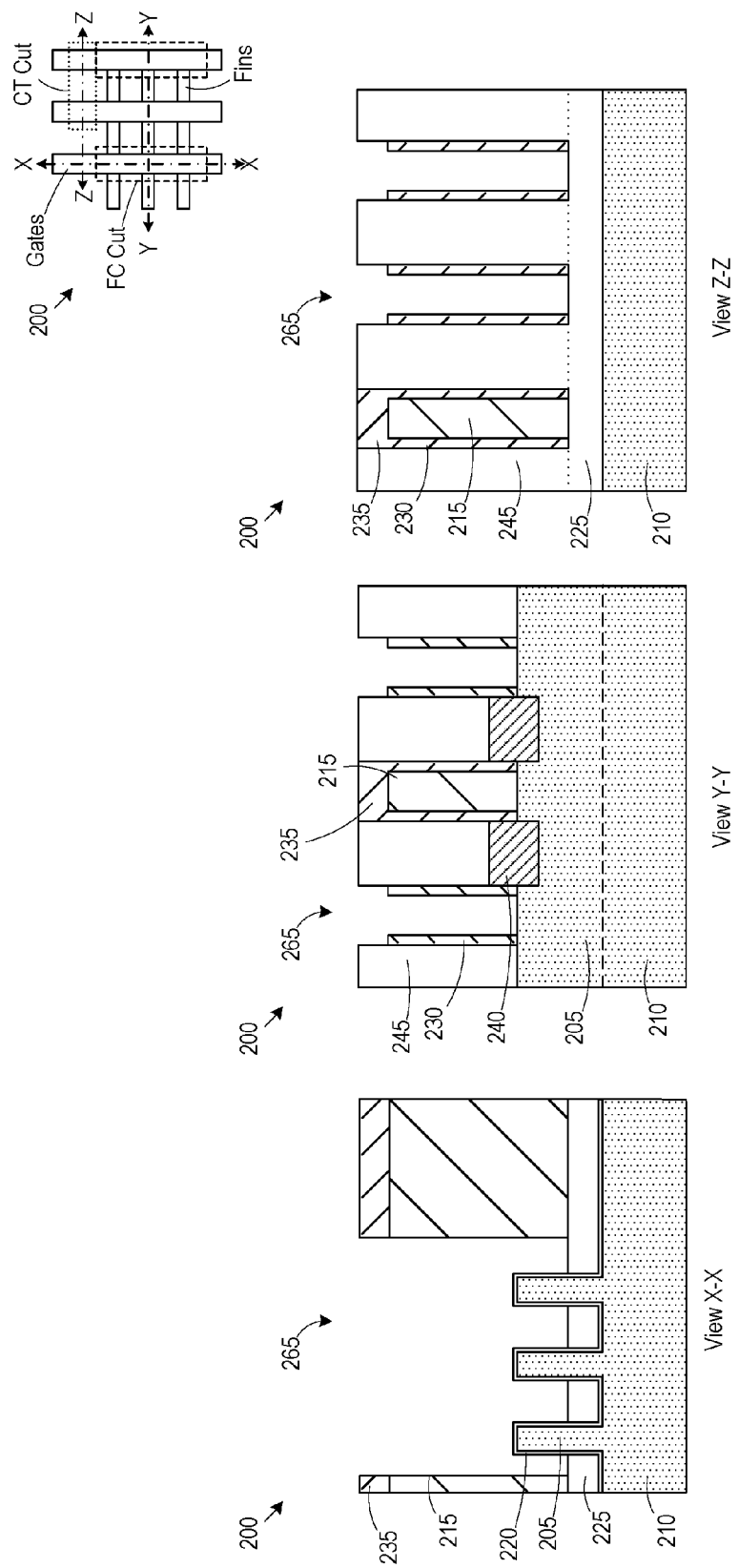

FIG. 2D illustrates the product 200 after a plurality of processes were performed. A strip process was performed to remove the hard mask layer 250. A selective etch process was performed to remove the exposed portions of the sacrificial material of the gate structures 215 (e.g., amorphous silicon) to define gate cut cavities 265. The removal of the sacrificial material of the gate structures 215 effectuates the gate cut process.

Figure 2E:
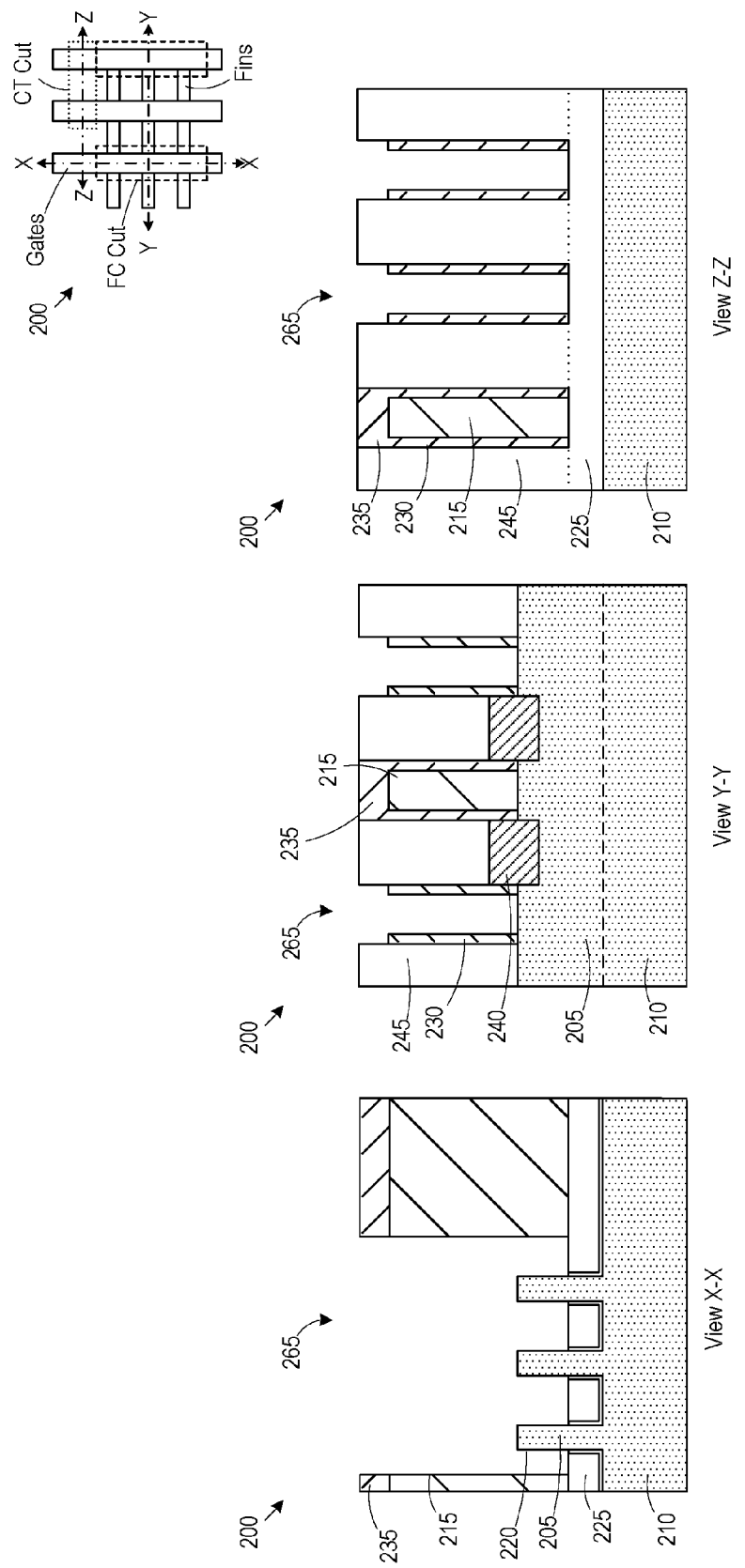

FIG. 2E illustrates the product 200 after a selective etch process was performed to remove the portions of the liner 220 and any gate insulation layer (not shown) remaining from the gate structures 215. The etch process exposes the fins 205 in the gate cut cavities 265.

Figure 2F:
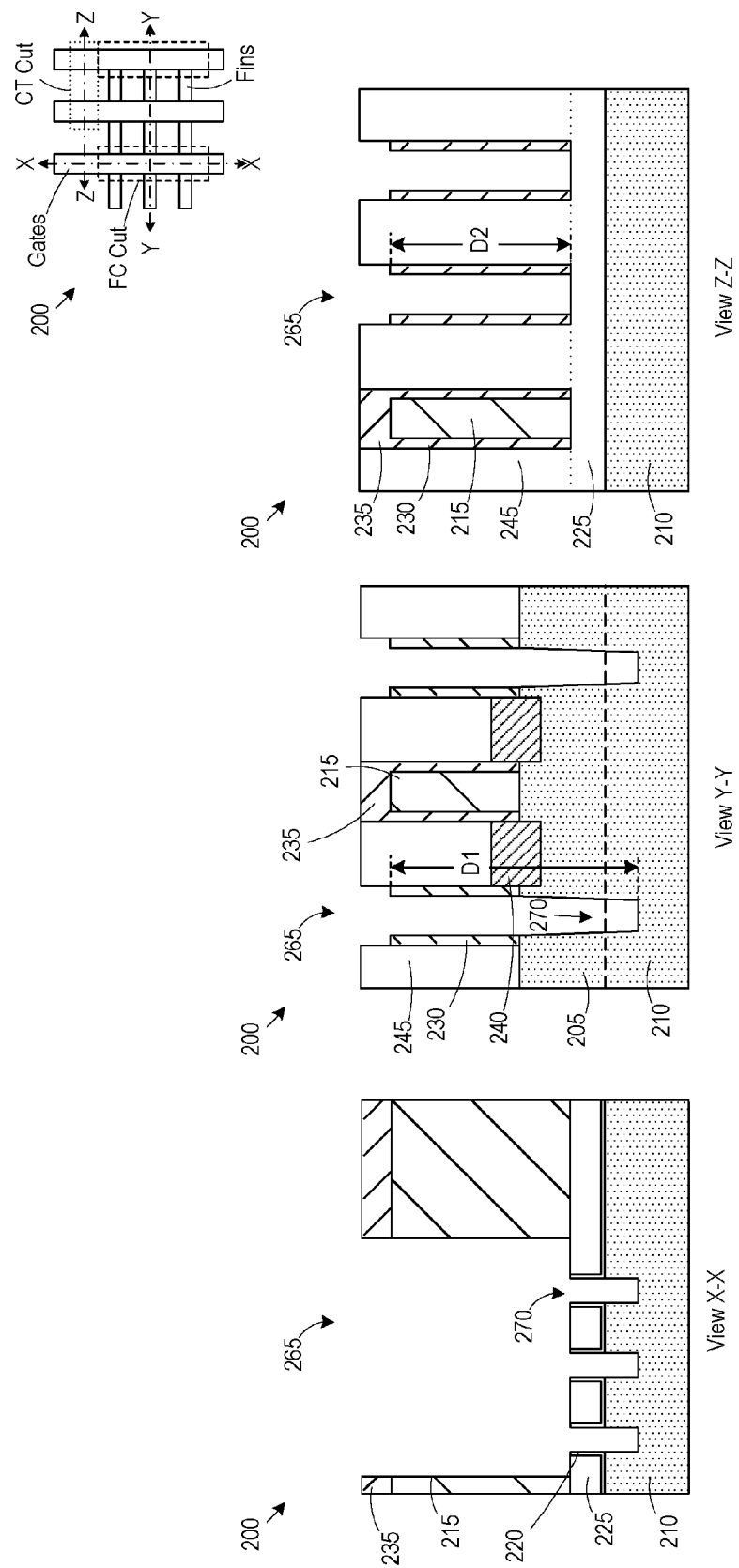

FIG. 2F illustrates the product 200 after a selective etch process was performed to etch the exposed portions of the fins 205 to effectuate the fin cut process. A degree of overetching is provided to define fin cut cavities 270 in the substrate 210. The fin cut etch also deepens the gate cut cavities 265 in the region above the exposed substrate 210. Hence, the gate cavities 265 have a first depth, D1, above the active region (i.e., the fin 205 and substrate 210) that is greater than a second depth, D2, above the dielectric layer 225 (i.e., the shallow trench isolation (STI) structure).

Figure 2G:
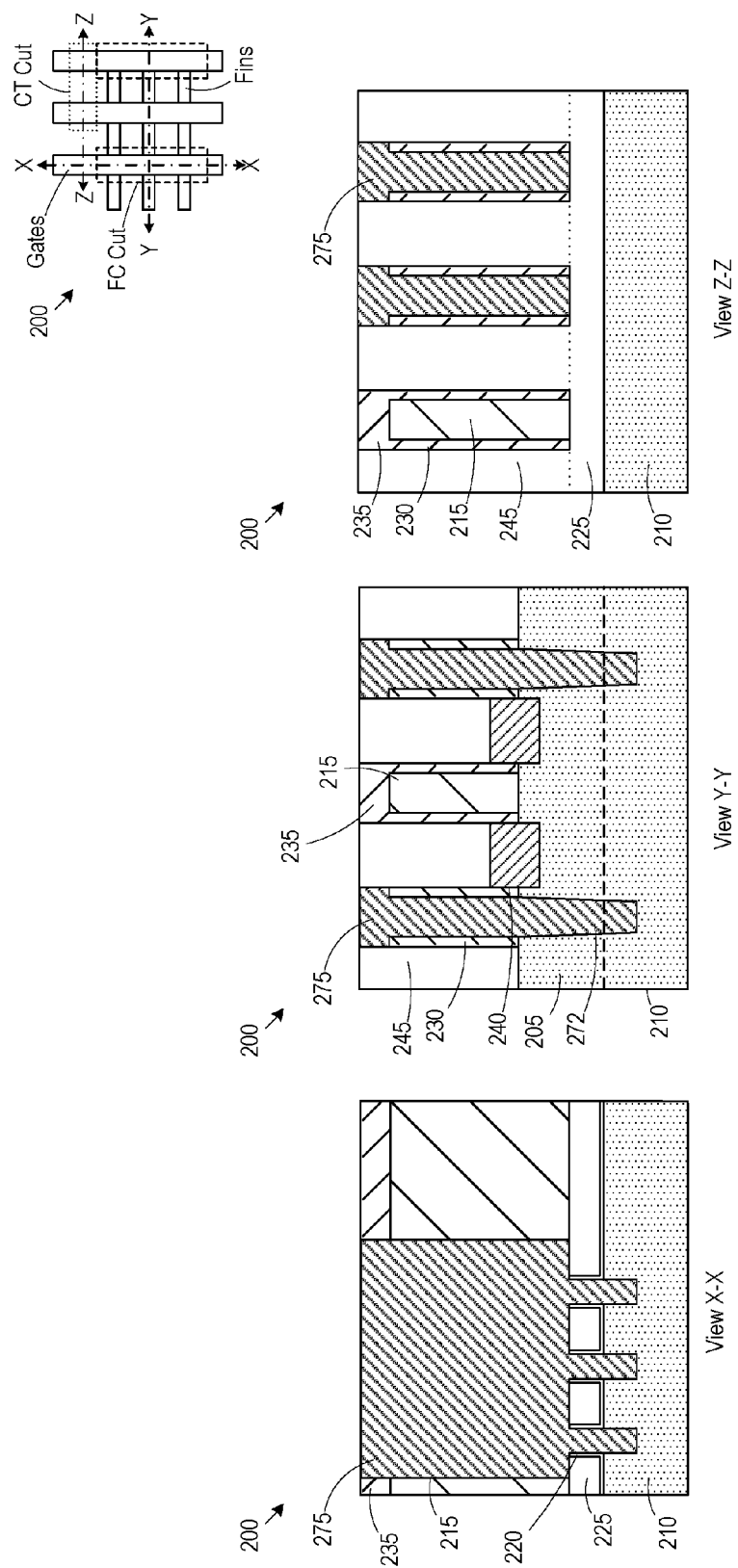

FIG. 2G illustrates the product 200 after a plurality of processes were performed. A deposition process was performed to form an insulating material layer 275 (e.g., silicon nitride) in the gate cut cavities 265 and the fin cut cavities 270. A planarization process was performed to remove portions of the insulating material layer 275 extending outside of the cavities 265, 270 above the dielectric layer 245, thereby defining diffusion breaks 272 in the fins 205.

Figure 2H:
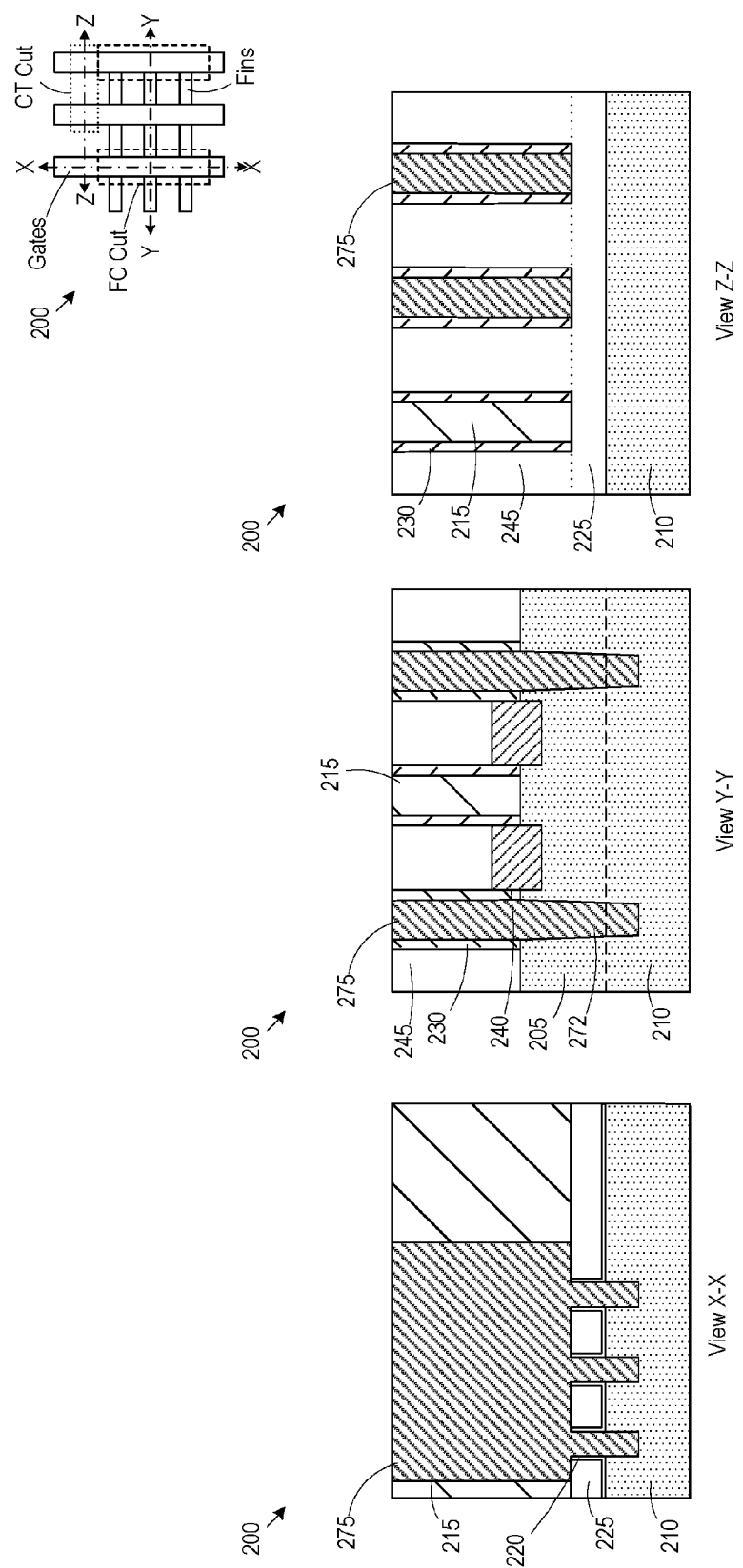

FIG. 2H illustrates the product 200 after a planarization process was performed to remove the cap layer 235 and expose a top surface of the remaining gate structures 215.

Figure 2I:
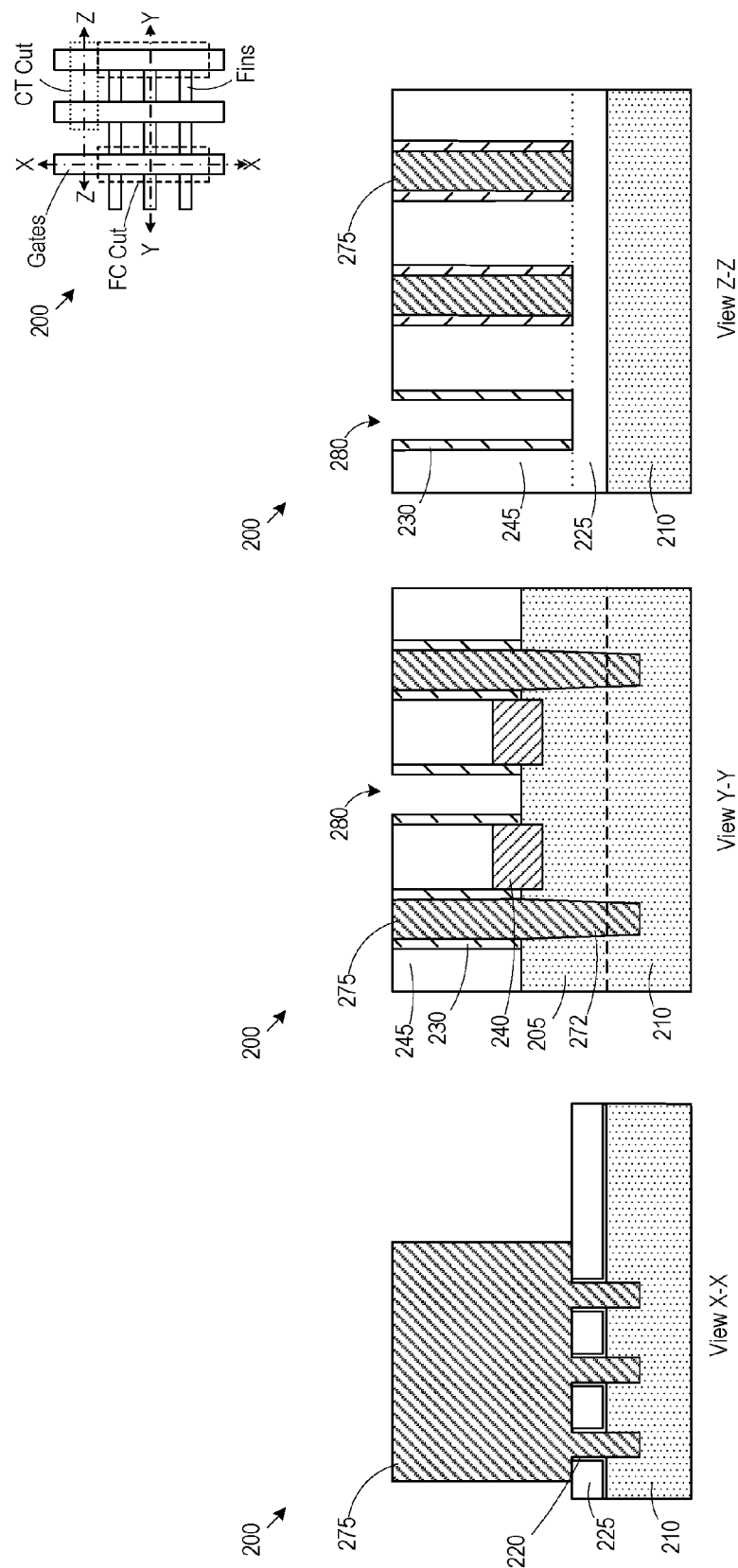

FIG. 2I illustrates the product 200 after a selective etch process was performed to remove the exposed portions of the gate structures 215 (e.g., amorphous silicon and gate insulation layer) to define gate cavities 280.

Figure 2J:
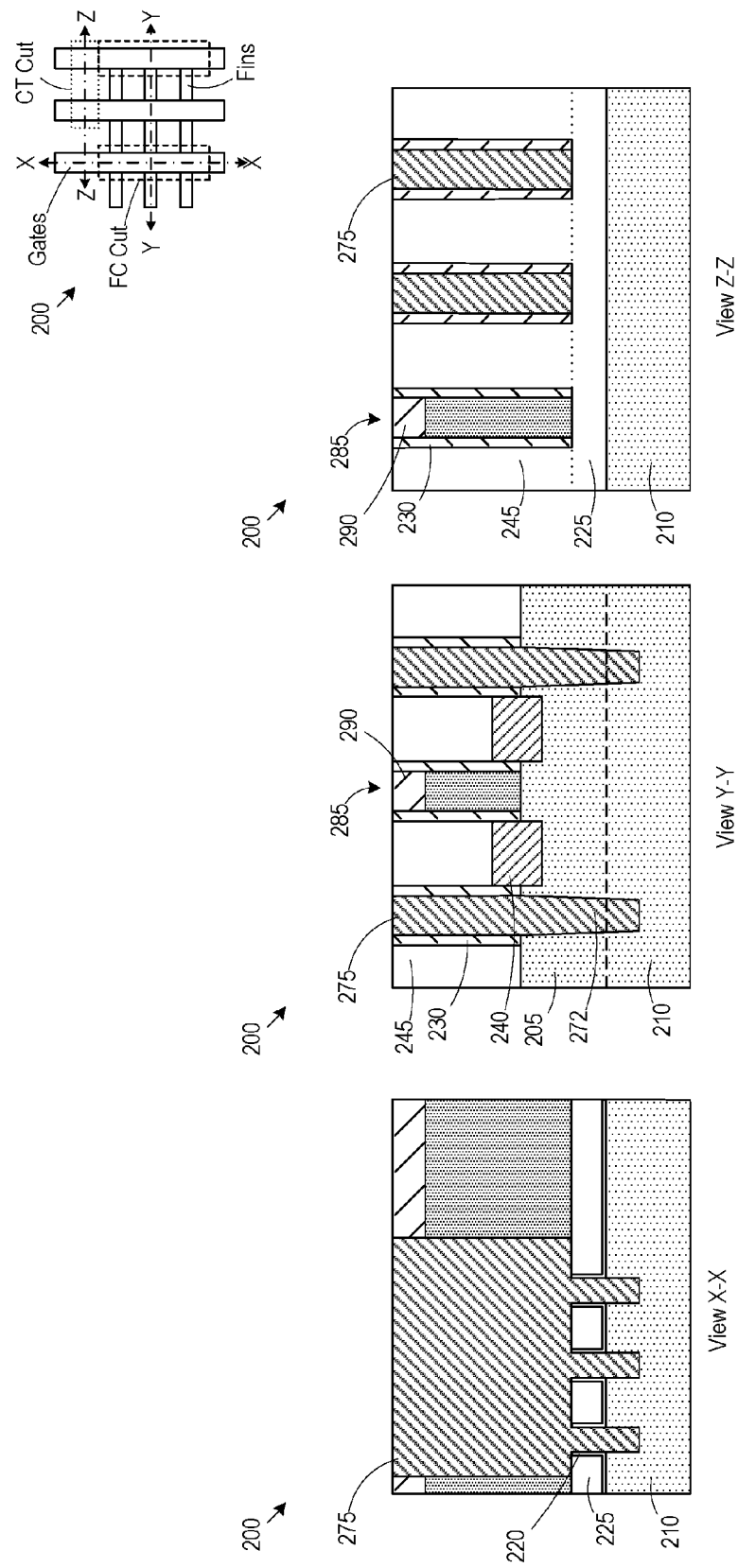

FIG. 2J illustrates the product 200 after a plurality of processes were performed to form replacement gate structures 285. The processes may include one or more deposition processes to form a gate insulation layer (e.g., silicon dioxide, hafnium oxide, or a high-k material) and one or more conductive layers (e.g., barrier layers, seed layers, fill layers) that will be part of a gate electrode of the replacement gate structure 285 (layers not separately shown). The conductive material may be planarized and recessed. A cap layer 290 may be formed above the gate structures 285.

Additional process steps may be formed to complete fabrication of the device 200, such as the forming of metallization layers including interconnects for contacting the various portions of the device 200, such as the source/drain regions 240 and the gate structures 285. The process flow illustrated above has several advantages. Because the fin and gate cut processes are effectuated using a single hard mask, the process flow is shortened, thereby increasing throughput and reducing costs.

The fin cut process may result in the cutting of a gate structure above the fin cut region. In the embodiment of FIGS. 2A-2J, the cut fin and gate structures are filled with insulating material. As a result, the gate region above the cut fin is not conductive. FIGS. 3A-3E depict an illustrative method for providing a conductive gate structure above a fin cut region.

Figure 3A:
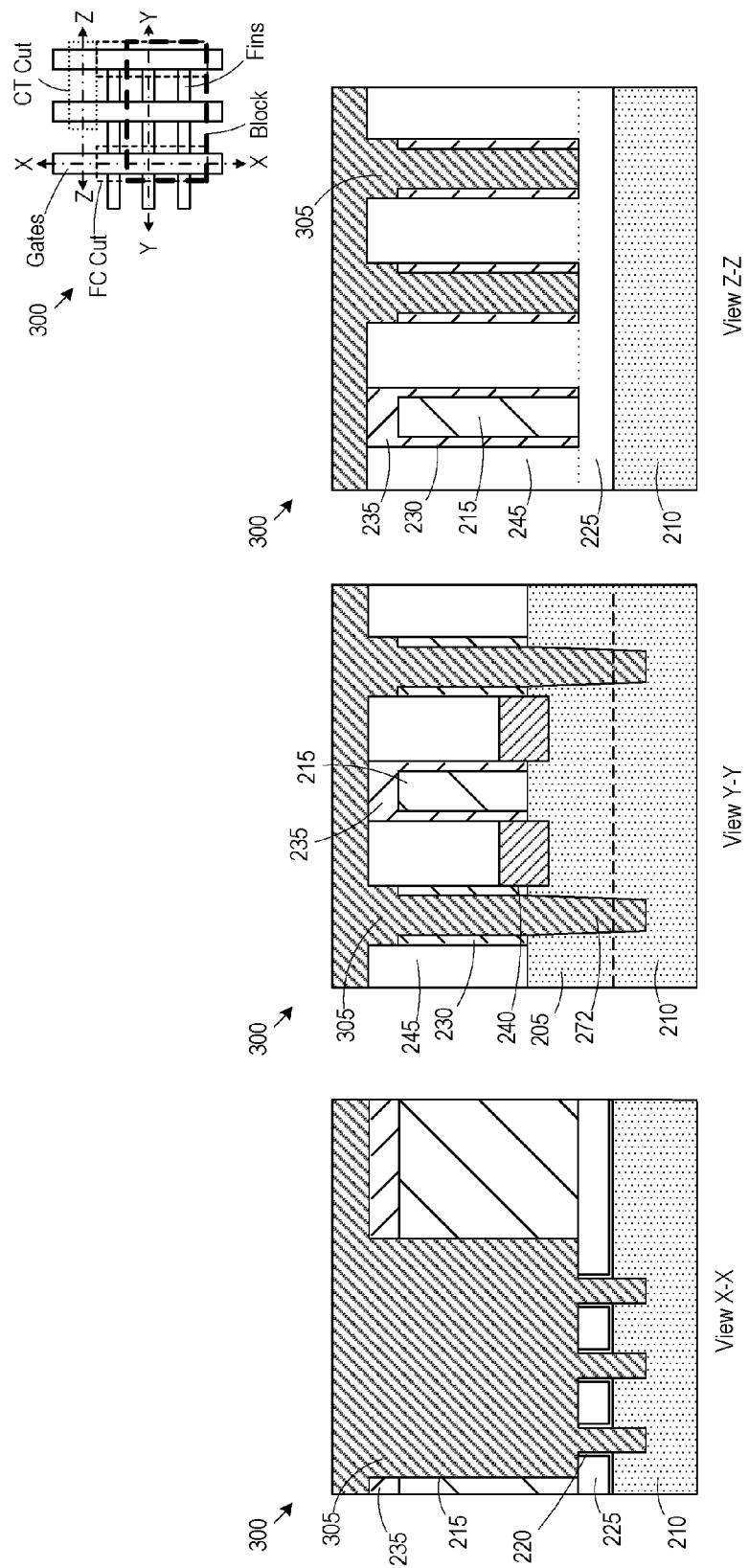
FIGS. 3A-3E depict an illustrative method for providing a conductive gate structure above a fin cut region.

FIG. 3A illustrates a product 300 in a stage corresponding to FIG. 2F after a plurality of processes were performed. A deposition process was performed to form an insulating material layer 305 (e.g., silicon nitride) in the gate cut cavities 265 and the fin cut cavities 270. A planarization process was performed to remove portions of the insulating material layer 305 above the dielectric layer 245, but the planarization process is terminated prior to clearing all of the insulating material layer 305 above the dielectric layer 245 (i.e., in contrast to FIG. 2G, where all of the insulating material layer 275 above the dielectric layer 245 is cleared).

Figure 3B:
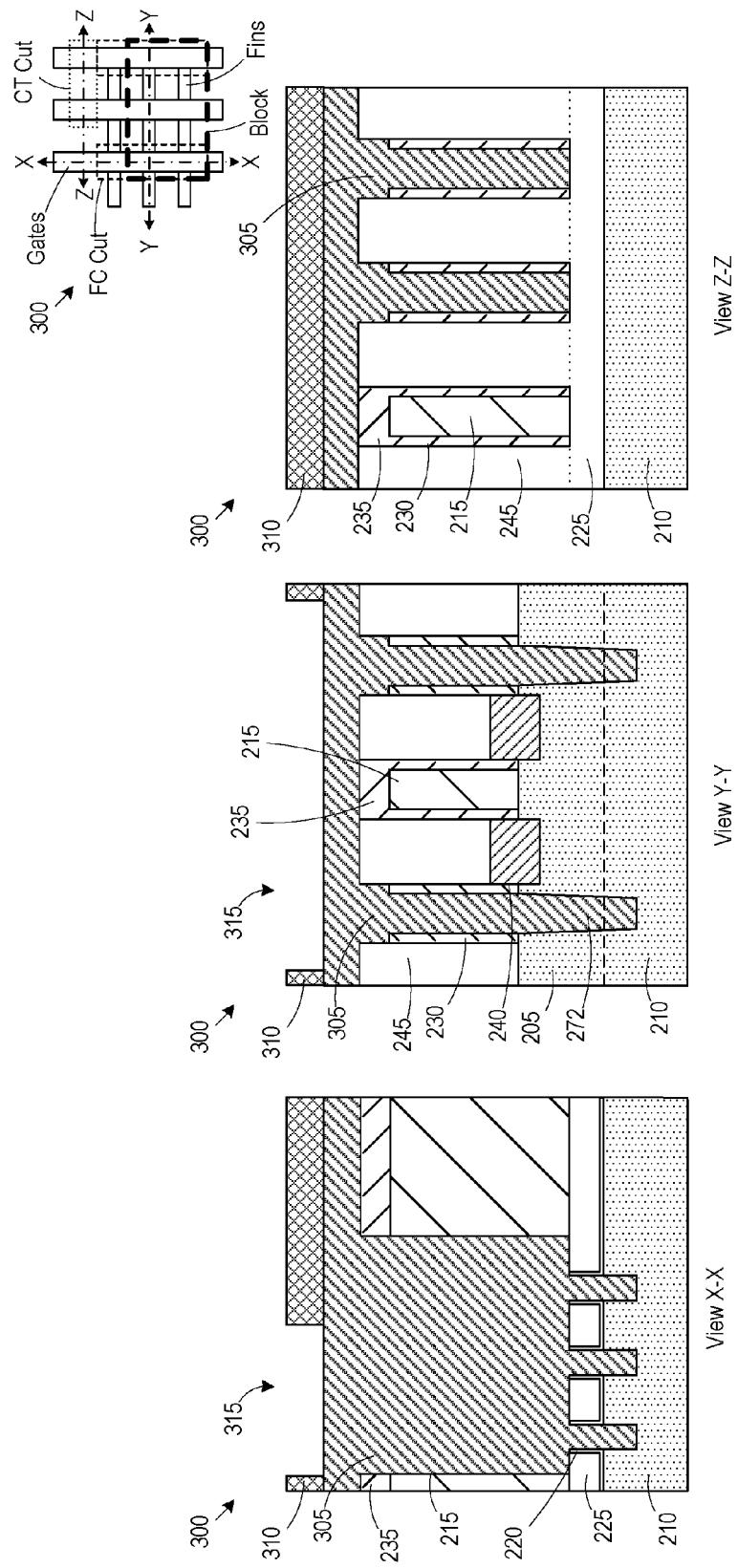

FIG. 3B illustrates the product 300 after a plurality of processes were performed to deposit and pattern a hard mask layer 310 above the dielectric layer 245 to define a block mask opening 315. The block mask exposes regions where the gate structures are to be made conductive. The photolithography constraints on block masks are typically reduced as compared to cut masks, and they are generally inexpensive to implement in a process flow. In the illustrated embodiment, the hard mask layer 310 was formed using a photolithography stack, including an organic planarization (OPL) layer, an anti-reflective coating (ARC) layer, and a photoresist layer. The ARC layer was formed above the OPL layer, and the photoresist was formed above the ARC layer. The photoresist layer was exposed to radiation using a reticle and developed to generate a pattern. The photoresist pattern was transferred to the ARC and OPL layers, and the photoresist and ARC layers were removed. Thus, the hard mask layer 310 may be the remaining OPL layer.

Figure 3C:
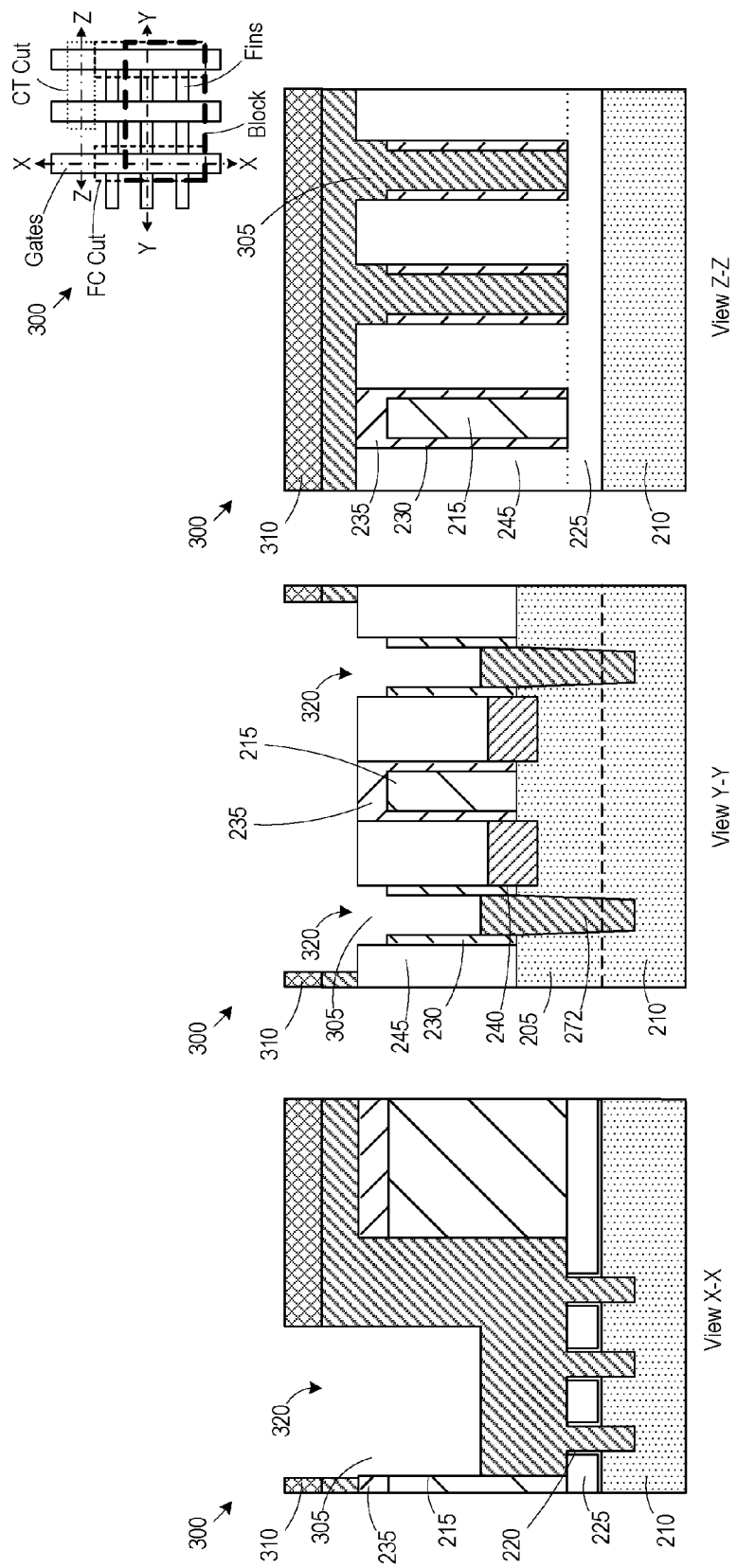

FIG. 3C illustrates the product 300 after a timed selective etch process was performed to etch the insulating material layer 305 to define dummy gate recesses 320.

Figure 3D:
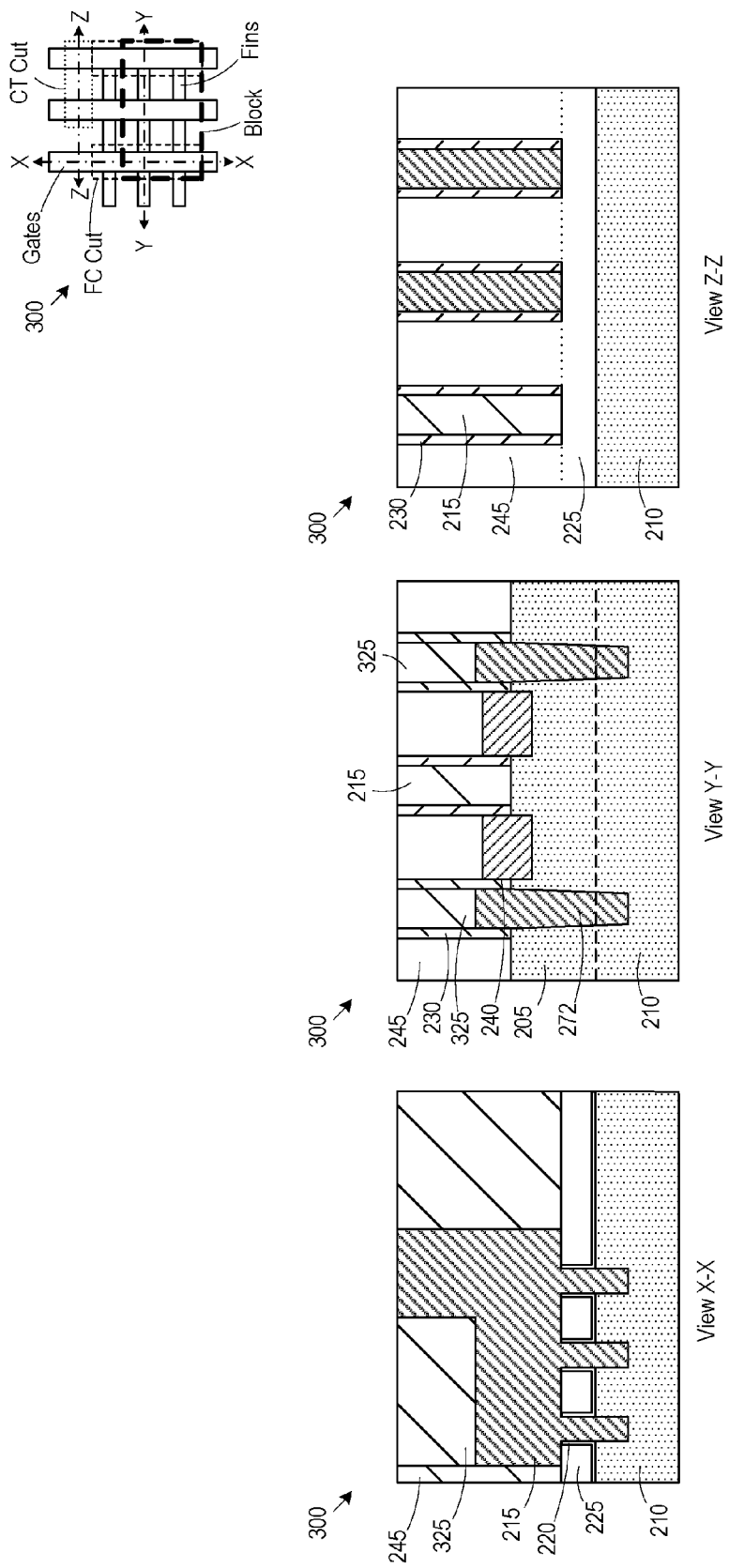

FIG. 3D illustrates the product 300 after a plurality of processes were performed. A strip process was performed to remove the hard mask layer 310. A deposition process was performed to form a sacrificial material 325 in the dummy gate recesses 320. A planarization process was performed to remove excess portions of the sacrificial material 325 and the cap layer 235 to expose a top surface of the remaining gate structures 215.

Figure 3E:
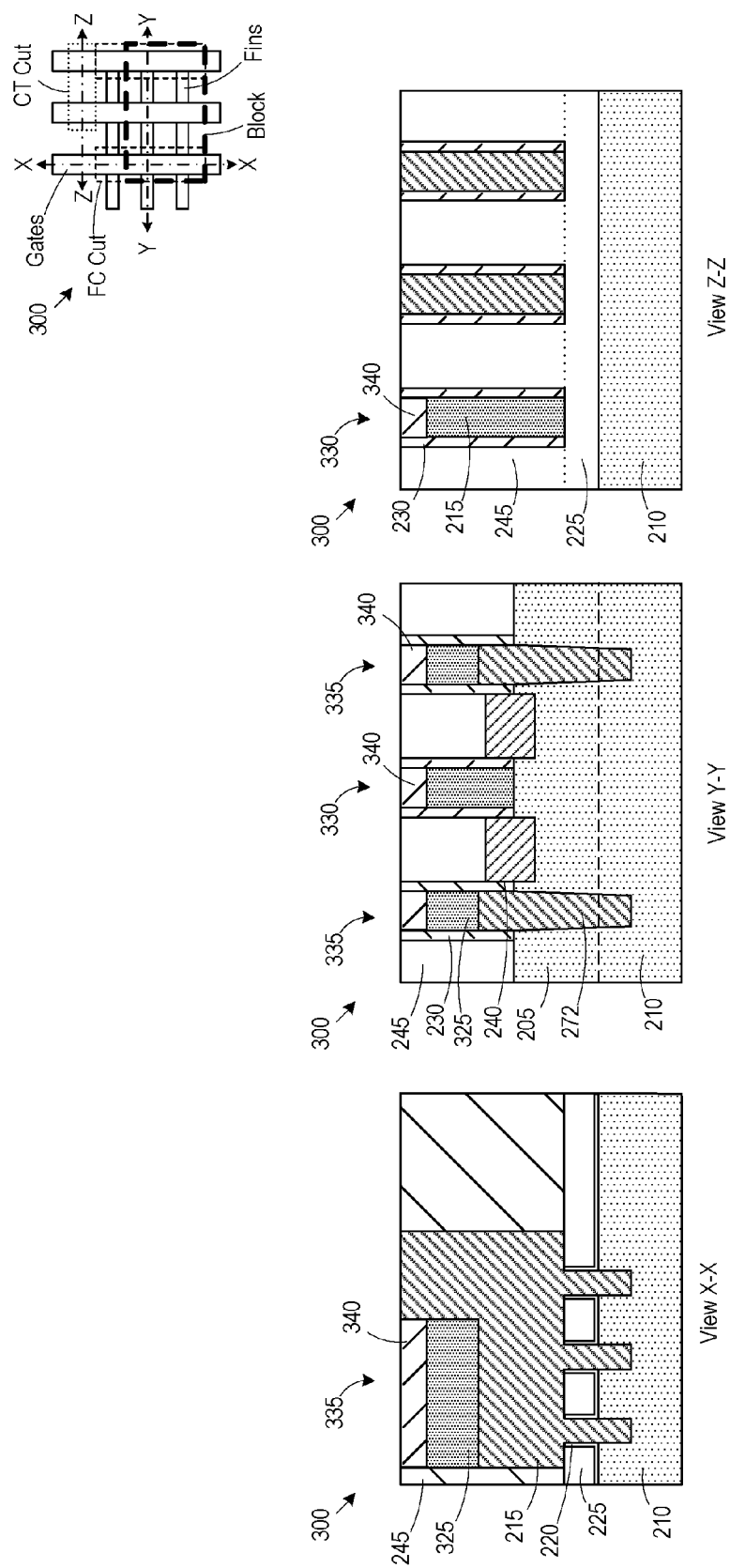

FIG. 3E illustrates the product 300 after a plurality of processes were performed. The processes of FIG. 2I were performed to remove the exposed portions of the gate structures 215 (e.g., amorphous silicon and gate insulation layer) and the sacrificial material 325 to define gate cavities. The processes of FIG. 2J were performed to form replacement gate structures 330 and dummy gate structures 335.

The dummy gate structures 335 are positioned above the diffusion breaks 272. The processes may include one or more deposition processes to form a gate insulation layer (e.g., silicon dioxide, hafnium oxide, or a high-k material) and one or more conductive layers (e.g., barrier layers, seed layers, fill layers) that will be part of a gate electrode of the replacement gate structure 330 and the dummy gate structures 335 (layers not separately shown). The conductive material may be planarized and recessed. A cap layer 340 may be formed above the replacement gate structure 330 and the dummy gate structures 335.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a plurality of fins above a substrate;
   forming a plurality of gate structures above said plurality of fins;
   forming a first mask layer above said plurality of fins and said plurality of gate structures, said first mask layer having at least one fin cut opening and at least one gate cut opening defined therein;
   removing a first portion of a first fin of said plurality of fins disposed below said fin cut opening to define a fin cut cavity;
   removing a second portion of a first gate structure of said plurality of gate structures disposed below said gate cut opening to define a gate cut cavity; and
   concurrently forming an insulating material layer in at least a portion of said fin cut cavity and said gate cut cavity.

2. The method of claim 1, further comprising removing a third portion of said substrate disposed below said second portion of said first gate structure to extend said gate cut cavity.

3. The method of claim 1, wherein removing said first portion of said first fin and removing said second portion of said first gate structure comprises performing a plurality of etch processes, wherein at least one of said plurality of etch processes is performed using said first mask layer as an etch mask.

4. The method of claim 1, further comprising:
   forming a cap layer above each of said plurality of gate structures;
   forming a first dielectric layer above said plurality of gate structures;
   planarizing said first dielectric layer to expose said cap layer;
   forming said first mask layer above said first dielectric layer;
   removing a third portion of said cap layer exposed by said fin cut opening to expose a fourth portion of a second gate structure of said plurality of gate structures;
   removing a fifth portion of said cap layer exposed by said gate cut opening to expose said second portion of said first gate structure;
   removing said second portion of said first gate structure to define said gate cut cavity; and
   removing said fourth portion of said second gate structure to expose said first portion of said first fin.

5. The method of claim 4, wherein removing said second and fourth portions comprises concurrently removing said second and fourth portions.

6. The method of claim 4, removing a sixth portion of said substrate exposed by said first gate cut opening to extend said first gate cut opening into said substrate.

7. The method of claim 6, further comprising forming a second dielectric layer in a bottom portion of trenches defined between adjacent fins prior to forming said plurality of gate structures, wherein said gate cut cavity exposes said substrate and a portion of said second dielectric layer and has a first depth where it extends into said substrate and a second depth, less than said first depth, where it exposes said second dielectric layer.

8. The method of claim 4, wherein concurrently forming said insulating material layer comprises:
   forming said insulating material layer above said first dielectric layer so as to fill said fin cut cavity and said gate cut cavity; and
   performing a planarizing process to remove portions of said insulating material layer extending beyond said fin cut cavity and said gate cut cavity.

9. The method of claim 4, wherein concurrently forming said insulating material layer comprises:
   forming said insulating material layer above said first dielectric layer so as to fill said fin cut cavity and said gate cut cavity; and
   planarizing said insulating material layer, wherein a portion of said insulating material layer remains above said first dielectric layer.

10. The method of claim 9, wherein said plurality of gate structures comprise a sacrificial material, the method further comprising:
    forming a second mask layer above said insulating material layer, said second mask layer having an opening exposing said insulating material layer;
    etching said insulating material layer through said second mask layer to define a dummy gate cavity therein;
    forming a layer of said sacrificial material in said dummy gate cavity;
    removing said cap layer to expose said sacrificial material of said plurality of gate structures;
    removing said sacrificial material from said plurality of gate structures to define a plurality of second gate cavities;
    removing said sacrificial material from said dummy gate cavity; and
    forming a conductive material in said plurality of second gate cavities and said dummy gate cavity.

11. The method of claim 10, further comprising forming a gate insulation layer in said plurality of second gate cavities and said dummy gate cavity prior to forming said conductive material.

12. The method of claim 4, further comprising removing said first hard mask layer prior to removing said second and fourth portions.

13. The method of claim 1, wherein said fin cut opening abuts said gate cut opening to define a non-rectangular combined opening.

14. The method of claim 1, wherein said fin cut opening has a first dimension extending in a direction perpendicular to a long axis of said first fin and a second dimension orthogonal to said first dimension, wherein said first dimension is greater than said second dimension.

15. The method of claim 1, wherein said gate cut opening has a first dimension extending in a direction parallel to a long axis of said first fin and a second dimension orthogonal to said first dimension, wherein said first dimension is greater than said second dimension.

16. The method of claim 1, further comprising replacing remaining portions of said gate structures with replacement material including a gate dielectric layer and a conductive material disposed above said gate dielectric layer.

17. A method, comprising:
   forming a product comprising a plurality of fins defined in a substrate, a plurality of gate structures above said plurality of fins, a cap layer disposed above said plurality of gate structures, and a first dielectric layer having a first top surface coplanar with a second top surface of said cap layer;
   forming a first mask layer above said cap layer and said first dielectric layer, said first mask layer having at least one fin cut opening and at least one gate cut opening defined therein;
   removing a first portion of said cap layer exposed by said gate cut opening to expose a second portion of a first gate structure of said plurality of gate structures;
   removing a third portion of said cap layer exposed by said fin cut opening to expose a fourth portion of a second gate structure of said plurality of gate structures;
   removing said first mask layer;
   removing said second portion of said first gate structure to define a gate cut cavity;
   removing said fourth portion of said second gate structure to expose a fifth portion of a first fin of said plurality of fins;
   removing said fifth portion of said first fin to define a first fin cut cavity; and
   concurrently forming an insulating material layer in at least a portion of said fin cut cavity and said gate cut cavity.

18. The method of claim 17, wherein concurrently forming said insulating material layer comprises:
   forming said insulating material layer above said first dielectric layer so as to fill said fin cut cavity and said gate cut cavity; and
   planarizing said insulating material layer, wherein a portion of said insulating material layer remains above said first dielectric layer.

19. The method of claim 18, wherein said plurality of gate structures comprise a sacrificial material, the method further comprising:
   forming a second mask layer above said insulating material layer, said second mask layer having an opening exposing said insulating material layer;
   etching said insulating material layer through said second mask layer to define a dummy gate cavity therein;
   forming a layer of said sacrificial material in said dummy gate cavity;
   removing said cap layer to expose said sacrificial material of said plurality of gate structures;
   removing said sacrificial material from said plurality of gate structures to define a plurality of second gate cavities;
   removing said sacrificial material from said dummy gate cavity; and
   forming a conductive material in said plurality of second gate cavities and said dummy gate cavity.

20. The method of claim 19, further comprising forming a gate insulation layer in said plurality of second gate cavities and said dummy gate cavity prior to forming said conductive material.

\* \* \* \* \*